United States Patent
Peter

(10) Patent No.: US 6,636,937 B2
(45) Date of Patent: Oct. 21, 2003

(54) SYSTEM AND METHOD FOR SAFE HIGH-TEMPERATURE OPERATION OF A FLASH MEMORY

(75) Inventor: Cornelius Peter, Buehl (DE)

(73) Assignee: TRW Automotive Electronics & Components GmbH & Co. KG, Radolfzell (DE)

( * ) Notice: Subject to any disclaimer, the term of this patent is extended or adjusted under 35 U.S.C. 154(b) by 230 days.

(21) Appl. No.: 09/931,261

(22) Filed: Aug. 16, 2001

(65) Prior Publication Data
US 2002/0021599 A1 Feb. 21, 2002

(30) Foreign Application Priority Data
Aug. 18, 2000 (DE) .......................... 100 40 890

(51) Int. Cl.⁷ ............................... G06F 12/00
(52) U.S. Cl. ........................ 711/103; 711/162
(58) Field of Search ................. 711/5, 103, 161, 711/162

(56) References Cited

U.S. PATENT DOCUMENTS

| | | | | |
|---|---|---|---|---|
| 6,198,663 B1 | * | 3/2001 | Takizawa | 365/185.29 |
| 2002/0116588 A1 | * | 8/2002 | Beckert et al. | 711/161 |
| 2002/0199056 A1 | * | 12/2002 | Ayukawa et al. | 711/106 |

FOREIGN PATENT DOCUMENTS

| | | |
|---|---|---|
| DE | 3133304 A1 | 3/1983 |
| DE | 19740525 C1 | 2/1999 |
| JP | 09106687 A | 4/1997 |
| JP | 10021693 A | 1/1998 |

* cited by examiner

*Primary Examiner*—Kevin Verbrugge
(74) *Attorney, Agent, or Firm*—Tarolli, Sundheim, Covell & Tummino L.L.P.

(57) ABSTRACT

The proposed system for safe high-temperature operation of a flash memory is suitable, more particularly, for use in automotive technology, for example, for a transmission controller, the flash memory being programmed prior to use at high temperatures such that each data set in the flash memory is saved redundant. The system is provided with a temperature sensor for sensing the temperature characterizing the temperature of the flash memory, and with a control unit connected to the temperature sensor and the flash memory. The control unit, including a timer, is configured such that it receives the temperature signals from the temperature sensor and is able to establish an accumulated heat load value of the flash memory by integrating the resulting temperature values versus time. When the accumulated heat load value exceeds a predefined heat load limit and the temperature characterizing the actual temperature of the flash memory drops below a predefined temperature limit selected such that a safe clearing/programming of the flash memory is possible, the control unit checks the sets of data for consistency, it then—when it has established consistency of a data set—being able to refresh the storage locations of the flash memory which are associated with the data set and then—when it has established that one of the redundant memorized sets of data is not consistent with the one or more corresponding sets of data matching therewith—being able to repair the incorrect data set in the flash memory by reprogramming on the basis of a correct data set such that it is consistent with the correct data set.

7 Claims, 2 Drawing Sheets

SYSTEM AND METHOD FOR SAFE HIGH-TEMPERATURE OPERATION OF A FLASH MEMORY

TECHNICAL FIELD

The invention relates to a system and method for safe high-temperature operation of a flash memory as may find application, more particularly, in conjunction with automotive transmission controllers.

BACKGROUND OF THE INVENTION

Employing flash memories (e.g. FEPROMs) in motor vehicles for memorizing vehicular parameters offers the possibility of cost-effective large-scale production of, for example, a transmission controller which is not programmed until being installed in a vehicle type. Flash memories feature a high storage density and permit blockwise clearing, whereby a speedy and simple programming is ensured. However, making use of such memories at high temperatures exceeding 100° C. as may be encountered in the field of automotive engineering, e.g. in the region of the transmission in the environment of which the flash memory may be located, poses serious problems because—due to electron mobility which increases exponentially with temperature—the storage locations lose their charge with time, resulting in the data retention time being reduced.

BRIEF SUMMARY OF THE INVENTION

It is thus the object of the invention to provide a system and method for operating a flash memory, in which the risk of data being lost due to use at high temperatures—as may be encountered e.g. in the region of a transmission of a motor vehicle, is reduced.

This is achieved in a system for safe high-temperature operation of a flash memory which is programmed prior to use at high temperatures such that each data set in the flash memory is saved redundant. The system comprises:

- a temperature sensor delivering temperature signals and sensing a temperature characterizing a temperature of the flash memory, and
- a control unit connected to the temperature sensor and the flash memory, the control unit comprising a timer and being configured such that it receives the temperature signals from the temperature sensor and is able to establish an accumulated heat load value of the flash memory by integrating the determined temperature values versus time and then
- when the accumulated heat load value exceeds a predefined heat load limit and
- the temperature characterizing an actual temperature of the flash memory drops below a predefined temperature limit selected such that a safe clearing/programming of the flash memory is possible,
- checks the sets of data for consistency, the control unit then
- when it has established consistency of a data set, being able to carry out a refresh of storage locations of the flash memory which are associated with the data set and then
- when it has established that one of the redundantly memorized sets of data is not consistent with one or more corresponding sets of data matching therewith, is able to repair the flash memory on the basis of a correct data set by reprogramming the incorrect data set such that it is consistent with the correct data set.

When an error occurs in a data set the control unit is firstly able to change over to another data set, due to the redundancy of the memorized data, and secondly to repair the faulty set of data on the basis of the other data set. Furthermore, regularly refreshing the memory content reduces the risk of loss of data due to high temperatures.

The object of the invention is further achieved by a method for safe high-temperature operation of a flash memory comprising at least one data set and being programmed prior to use at high temperatures such that each of said sets of data in said flash memory is saved redundant, said method comprising the following steps:

- sensing a temperature characterizing a temperature of said flash memory, and
- integrating said sensed temperature values versus time to establish an accumulated heat load value of said flash memory and
- checking said sets of data for consistency,
- when said accumulated heat load value exceeds a predefined heat load limit and
- when said temperature characterizing an actual temperature of said flash memory drops below a predefined temperature limit selected such that a safe clearing/programming of said flash memory is possible, and
- when consistency of one data set is established, there is carried out a refresh of storage locations of said flash memory which are associated with said data set, and
- when it is established that one of said redundant memorized sets of data is not consistent with one or more corresponding sets of data matching therewith, said incorrect data set in said flash memory is repaired by reprogramming on the basis of a correct data set such that it is consistent with said correct data set.

Further aspects and advantages of the invention read from the sub-claims.

DETAILED DESCRIPTION OF THE PREFERRED EMBODIMENT

Figure 1:
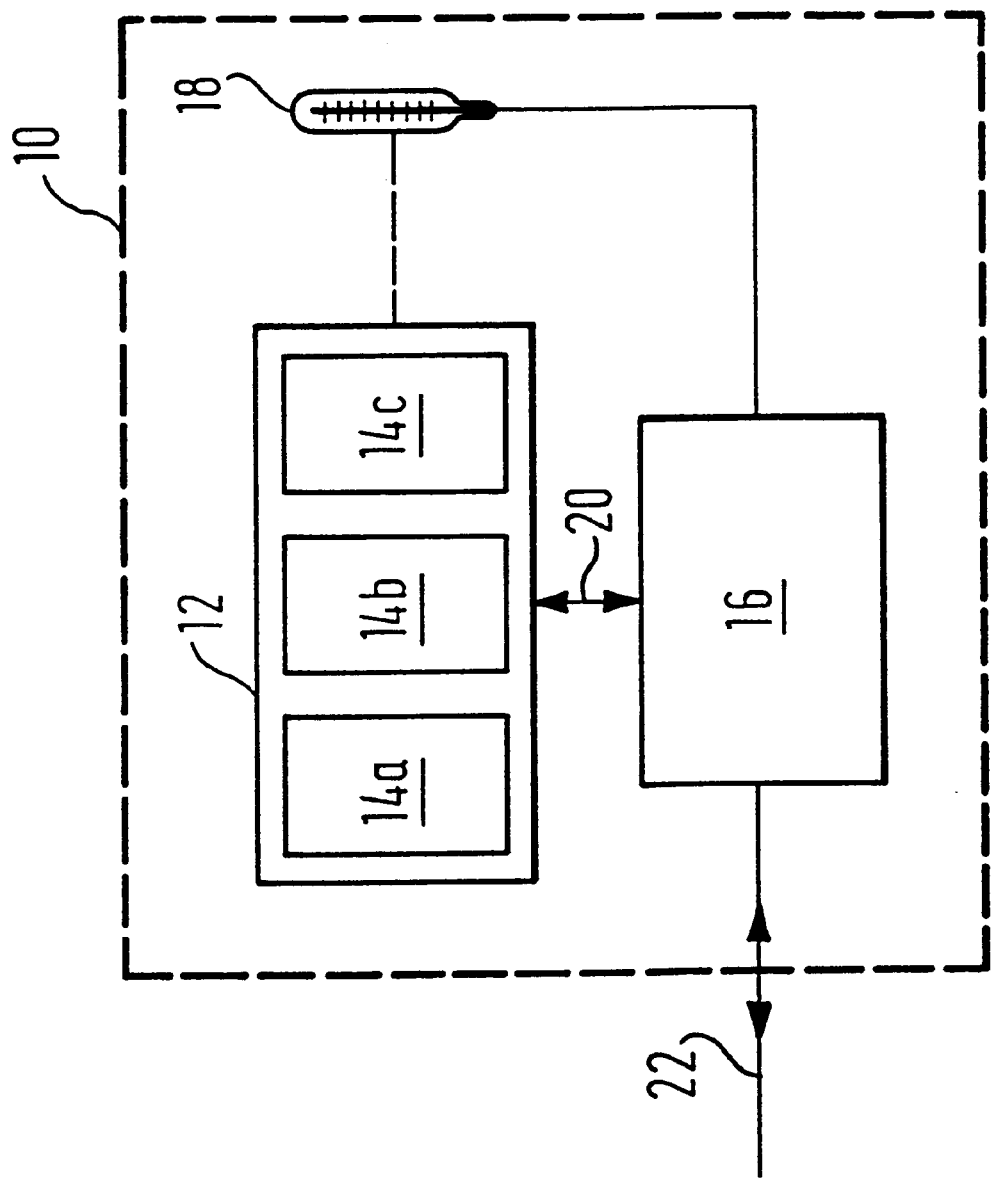
FIG. 1 is a block diagram of a system in accordance with the invention for safe high-temperature operation of a flash memory.

Referring now to FIG. 1 there is illustrated the system 10 comprising a flash memory 12 organized in three blocks 14a, 14b and 14c, a control unit 16 and a temperature sensor 18, the latter being in thermal contact with the flash memory 12 or its immediate environment. The temperature sensor 18 is connected to the control unit 16 to which it continually furnishes signals representing the actual temperature values. The control unit which may contain e.g. a processor (not shown) including a ROM memory, converts these signals into digital temperature values. Via the control- and data lines 20 shown schematically, the control unit 16 is able to clear, write (program) and read each of the three blocks 14a, 14b and 14c. In addition, the control unit 16 is connected via lines 22 to other assemblies (not shown in FIG. 1) outside the system 10, with which it can swap instructions and data.

Saved in the three blocks 14a, 14b and 14c are identical sets of data, each of which is preferably supplemented by checksums likewise saved in the blocks.

Figure 2:
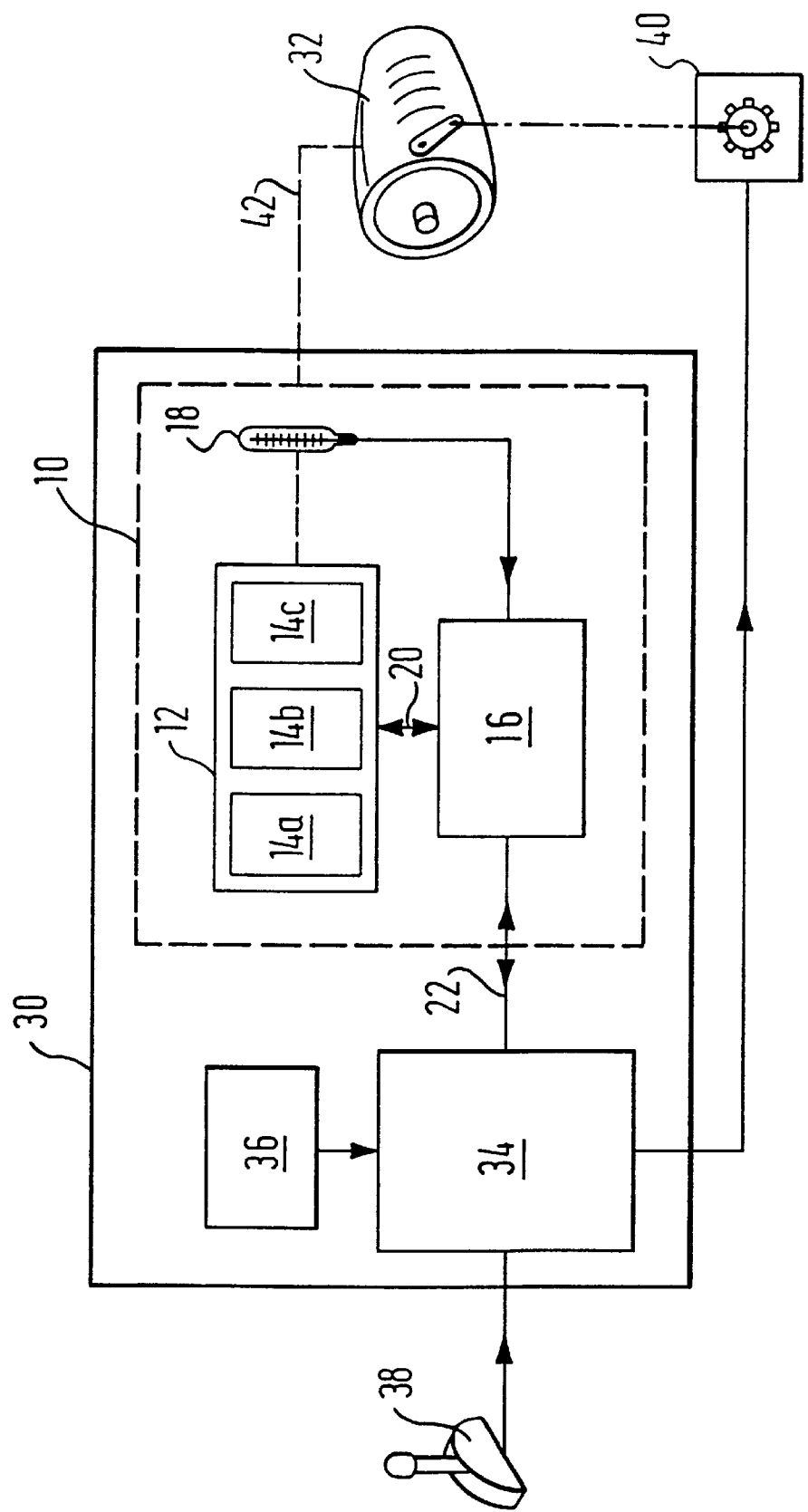
FIG. 2 is a schematic diagram of an automotive transmission in which the system as shown in FIG. 1 is employed.

Referring now to FIG. 2 there is illustrated one exemplary application of the system 10 in which a transmission controller 30 in accordance with the invention is fitted to a transmission 32 of a vehicle. The transmission controller 30 consists of the system 10 as shown in FIG. 1, a microcontroller 34 and a read-only memory (ROM) 36. The transmission controller 30 is electrically connected to a selector lever 38 and a servomotor 40 for positioning the transmission 32. Programmed in the ROM 36 is the operating system for the microcontroller 34 connected to the control unit 16. Saved in the flash memory 12 are the optimum parameters and programs for gear-shifting the transmission.

The transmission controller 30 has the task of optimally controlling the transmission 32 as dictated by the selector lever 38. For this purpose, the control unit receives from the selector lever 38 the request to shift the transmission 32 into a higher or lower gear or to take over automatic control of the transmission. By means of the data saved in the flash memory 12 the microcontroller 34 then signals the servomotor 40 to make the gearchange. Since the transmission controller 30 and, thus, also the system 10 are in direct thermal contact 42 with the transmission 32, the flash memory 12 is exposed to the temperatures of the transmission fluid which may typically be as high as 140° C. and may even attain 150° C. due to exposure to the radiation of a catalytic converter optionally provided in the vicinity.

Upon switching the ignition ON, the system 10 is set by the microcontroller 34 from standby to the active state in which it can transfer the gearchange parameters and programs to the microcontroller 34. Entering the activated state, the control unit 16 checks the consistency of the sets of data saved in the flash memory on the basis of the saved checksums assigned thereto which permit a rapid check of the data sets for correctness. There is also the possibility, however, of comparing the data of the individual blocks 14a, 14b and 14c to each other bytewise. Checking for consistency may also be done successively, with first the checksum being checked and then, if the checksum contains an error, byte-wise checking being done. If checking shows that all data is satisfactory, the control unit 16 is able to transfer any data set for controlling the transmission 32. If checking shows that an error exists in the sets of data, then the control unit selects a data set, having no error, for controlling the transmission.

Switching the ignition subsequently OFF returns the system 10 to standby. Any data set including an error is then repaired by the control unit 16 by the complete faulty data set being cleared and reprogrammed by the data from one of the error-free data sets. This repair only takes place, however, once the temperature of the flash memory as monitored by means of the temperature sensor 18 has dropped below a critical temperature limit, in this case 120° C., the critical temperature limit being selected such that clearing and programming the flash memory is safely ensured. Above the critical temperature of 120° C., no programming and clearing actions are implemented, in order to avoid any additional load on the flash memory and the attendant risk of data being lost.

For the unlikely case that all three sets of data include an error, the microcontroller 34 is able to control the transmission by way of an optimized emergency routine programmed in the ROM 36.

In addition, the control unit 16 continually determines an accumulated heat load value for the data in the flash memory. For this purpose the control unit 16 integrates, versus time, the temperature of the flash memory 12 as sensed by the temperature sensor 18 and transferred to the control unit 16, each temperature value being provided with a temperature-dependent weighting factor. The weighting factors may be determined, for example, by the minimum data retention time being established for each temperature value, during which time the data is memorized error-free at constant temperature.

If the heat load value obtained from integration exceeds a predefined heat load limit (which may correspond e.g. to a load of the flash memory of 120° C. for 30 hrs, 130° C. for 10 hrs, 140° C. for 3 hrs or 150° C. for 1 hr or corresponding combinations of intermediate temperatures and time durations) for which a total loss of data can be safely excluded with sufficient probability, then the control unit 16 executes a refresh action as soon as the system 10 is on standby and the monitored temperature of the flash memory 12 has dropped below the temperature limit. In so doing, all blocks 14a, 14b and 14c are first checked by checking for consistency for no error, as explained above. After that, a first block is selected whose data set is totally cleared, this block being reprogrammed with the data set of a neighboring error-free block. Subsequently the same action is executed for the next block, and so on, until all blocks 14a, 14b and 14c have been reprogrammed. After this refresh action integration of the heat load value is restarted. If in checking, the data set of a block is "seen" to have an error, then this block is selected first, cleared and reprogrammed so that at least one error-free data set remains. It is in this way that the faulty data set is repaired in making use of the redundancy of the data in the course of refreshing as described above.

If the system 10 is set from standby to the active state, whilst a data set is being repaired or refreshed, then the control unit 16 interrupts the repair or refresh action and does not continue therewith until the system 10 is again on standby and the temperature of the flash memory monitored by the temperature sensor 18 has dropped below a critical temperature limit, in this case 120° C.

Regularly refreshing the memory content reduces the risk of data being lost, and the number of programming and clear actions can be optimized by adapting the time between two refresh actions in sequence, i.e. the cycle time, as a function of the temperatures to which the flash memory has been exposed since the last refresh action. It is in this way that the load on the memory and also the current consumption of the system can be minimized, thus the useful life of the flash memory being maximized.

What is claimed is:

1. A system for safe high-temperature operation of a flash memory comprising at least one data set and being programmed prior to use at high temperatures such that each of said sets of data in said flash memory is saved redundant, said system comprising:

a temperature sensor delivering temperature signals and sensing a temperature characterizing a temperature of said flash memory, and a control unit connected to said temperature sensor and said flash memory, said control unit comprising a timer and being configured such that it receives said temperature signals from said temperature sensor and is able to establish an accumulated heat load value of said flash memory by integrating said determined temperature values versus time and then when said accumulated heat load value exceeds a predefined heat load limit and said temperature characterizing an actual temperature of said flash memory drops below a predefined temperature limit selected such that a safe clearing/
programming of said flash memory is possible, checks said sets of data for consistency, said control unit then when it has established consistency of one data set, being able to carry out a refresh of storage locations of said flash memory which are associated with said data set and then, when it has established that one of said redundantly memorized sets of data is not consistent with one or more corresponding sets of data matching therewith, is able to repair said flash memory on the basis of a correct data set by reprogramming said incorrect data set such that it is consistent with said correct data set.

2. The system as set forth in claim 1, wherein each of said sets of data is provided with a checksum which is made use of for checking consistency.

3. The system as set forth in claim 1, wherein said sets of data for ensuring redundancy in said flash memory are saved multiply identical.

4. The system as set forth in claim 3, wherein said control unit is configured such that it checks for consistency said sets of data saved multiply, said checking being carried out by bytewise comparison.

5. A transmission controller including a system as set forth in claim 1.

6. A transmission connected to a transmission controller as set forth in claim 5.

7. A method for safe high-temperature operation of a flash memory comprising at least one data set and being programmed prior to use at high temperatures such that each of said sets of data in said flash memory is saved redundant, said method comprising the following steps:

sensing a temperature characterizing a temperature of said flash memory, and integrating said sensed temperature values versus time to establish an accumulated heat load value of said flash memory and checking said sets of data for consistency, when said accumulated heat load value exceeds a predefined heat load limit and when said temperature characterizing an actual temperature of said flash memory drops below a predefined temperature limit selected such that a safe clearing/programming of said flash memory is possible, and when consistency of one data set is established, there is carried out a refresh of storage locations of said flash memory which are associated with said data set, and when it is established that one of said redundant memorized sets of data is not consistent with one or more corresponding sets of data matching therewith, said incorrect data set in said flash memory is repaired by reprogramming on the basis of a correct data set such that it is consistent with said correct data set.

* * * * *